(12) United States Patent
Fujisawa et al.

(10) Patent No.: US 11,943,894 B2
(45) Date of Patent: Mar. 26, 2024

(54) CONTROL DEVICE FOR ROBOT WITH BLOWER DEVICE AT OPENING

(71) Applicant: KAWASAKI JUKOGYO KABUSHIKI KAISHA, Kobe (JP)

(72) Inventors: Noriaki Fujisawa, Kobe (JP); Yoshiaki Tonoue, Kobe (JP)

(73) Assignee: KAWASAKI JUKOGYO KABUSHIKI KAISHA, Kobe (JP)

(*) Notice: Subject to any disclaimer, the term of this patent is extended or adjusted under 35 U.S.C. 154(b) by 272 days.

(21) Appl. No.: 17/617,167

(22) PCT Filed: Jun. 8, 2020

(86) PCT No.: PCT/JP2020/022496
§ 371 (c)(1),
(2) Date: Dec. 7, 2021

(87) PCT Pub. No.: WO2020/246613
PCT Pub. Date: Dec. 10, 2020

(65) Prior Publication Data
US 2022/0258362 A1    Aug. 18, 2022

(30) Foreign Application Priority Data
Jun. 7, 2019 (JP) .................................. 2019-106793

(51) Int. Cl.
*H05K 7/20*    (2006.01)
*B25J 13/06*   (2006.01)
(Continued)

(52) U.S. Cl.
CPC .......... *H05K 7/20163* (2013.01); *B25J 13/06* (2013.01); *B25J 19/0054* (2013.01); *H05K 5/0213* (2013.01); *H05K 5/0247* (2013.01); *H05K 7/20136* (2013.01); *H05K 7/2039* (2013.01); *H05K 5/0217* (2013.01)

(58) Field of Classification Search
CPC ... B25J 19/0054; B25J 13/06; H05K 7/20136; H05K 7/20145; H05K 7/20154;
(Continued)

(56) References Cited

U.S. PATENT DOCUMENTS 6,164,369 A * 12/2000 Stoller ............... H05K 7/20572
                                                165/104.34
7,816,631 B2 * 10/2010 Cramer .............. H05K 7/20918
                                                219/757
(Continued)

FOREIGN PATENT DOCUMENTS

JP    2005-529426 A    9/2005
JP    2010-205826 A    9/2010
(Continued)

*Primary Examiner* — Zachary Pape
*Assistant Examiner* — Steven Ngo
(74) *Attorney, Agent, or Firm* — Oliff PLC

(57) ABSTRACT

A robot control device includes a casing including a main body having a first opening and a second opening, and a door opening and closing the first opening, a first circuit including a heat generating element, and at least one blower device. The main body includes a first chamber accommodating the first circuit and open at the first opening, and a second chamber adjacent to the first chamber and open at the first opening and the second opening. When the door closes the first opening, the door closes the first chamber and communicates the second chamber with the outside via a door opening of the door. The blower device is disposed at least one of positions at the door opening, near the door opening, at the second opening, and near the second opening, and is configured to introduce and discharge air into/from the second chamber.

12 Claims, 8 Drawing Sheets

(51) Int. Cl.
  *B25J 19/00* (2006.01)
  *H05K 5/02* (2006.01)
(58) Field of Classification Search
  CPC ............ H05K 7/20163; H05K 7/2039; H05K 7/20409; H05K 7/20418; H05K 7/205; H05K 7/20509; H05K 5/0213; H05K 5/0217; H05K 5/0247; H05K 9/0037; H05K 2201/09754; H05K 2201/0999; A47B 96/04
  See application file for complete search history.

(56) References Cited

U.S. PATENT DOCUMENTS

| | | | |
|---|---|---|---|
| 9,258,924 B2 * | 2/2016 | Wu | H05K 7/20163 |
| 2007/0123081 A1 * | 5/2007 | Hirabayashi | H05K 7/1471 |
| | | | 439/164 |
| 2011/0058330 A1 * | 3/2011 | Abraham | G06F 1/20 |
| | | | 361/679.54 |
| 2015/0029663 A1 * | 1/2015 | Tagei | H05K 7/2089 |
| | | | 361/690 |
| 2016/0174400 A1 * | 6/2016 | Nakano | H05K 5/0018 |
| | | | 361/807 |
| 2020/0016775 A1 | 1/2020 | Tagashira | |

FOREIGN PATENT DOCUMENTS

| | | |
|---|---|---|
| JP | 2014-123591 A | 7/2014 |
| JP | 2016-163392 A | 9/2016 |
| JP | 2016-197673 A | 11/2016 |
| JP | 2018-140453 A | 9/2018 |
| JP | 2019-040968 A | 3/2019 |
| WO | 03/105549 A1 | 12/2003 |
| WO | WO-03105549 A1 * | 12/2003 ........... H05K 7/1467 |

* cited by examiner

CONTROL DEVICE FOR ROBOT WITH BLOWER DEVICE AT OPENING

CROSS REFERENCE TO RELATED APPLICATIONS

This is a National Phase of Application No. PCT/JP2020/022496 filed Jun. 8, 2020, which claims priority to Japanese Application No. 2019-106793 filed Jun. 7, 2019. The disclosure of the prior applications is hereby incorporated by reference herein in its entirety.

TECHNICAL FIELD

The present disclosure relates to a control device for a robot.

BACKGROUND ART

Conventionally, control devices, which accommodate therein a heating element, such as a servo amplifier for controlling a servo motor, are known. For example, Patent Document 1 discloses a controller for an industrial robot device. The controller is provided with a cabinet with drawers. A drive provided with a power source unit is disposed inside the drawer. The controller includes a ventilation duct which penetrates inside of the drawer, and a fan which forcibly generates a flow of air inside the ventilation duct.

REFERENCE DOCUMENT OF CONVENTIONAL ART

Patent Document

[Patent Document 1] JP2005-529426A

DESCRIPTION OF THE DISCLOSURE

Problem to be Solved by the Disclosure

In the controller of Patent Document 1, the drawer is inserted into a space of the cabinet to make the space be in a substantially airtight state. The ventilation duct is constructed to pass through the inside of the drawer. Further, the controller of Patent Document 1 is provided with a structure for electrically connecting the drive to the device of the cabinet when the drawer is inserted. Therefore, there is a problem that the controller of Patent Document 1 has a large number of components and the structure is complicated.

Thus, one purpose of the present disclosure is to provide a control device for a robot, which enables simplification of the structure thereof.

SUMMARY OF THE DISCLOSURE

In order to achieve the purpose, according to the present disclosure, a control device for a robot is provided, which includes a casing including a main body having a first opening and a second opening disposed at a wall opposing to the first opening, and a door provided to the main body so as to open and close the first opening, a first circuit including a heat generating element configured to generate heat by being supplied with power, and at least one blower device. The main body includes a first chamber accommodating the first circuit and open at the first opening, and a second chamber adjacent to the first chamber via a first partition wall and open at the first opening and the second opening. The door has a door opening penetrating the door and disposed so as to be communicable with the second chamber. When the door closes the first opening, the door closes the first chamber and communicates the second chamber with the outside via the door opening. The at least one blower device is disposed at least one of positions at the door opening, near the door opening, at the second opening, and near the second opening, and is configured to introduce and discharge air into/from the second chamber.

Effect of the Disclosure

According to the technology of the present disclosure, the structure of a control device for a robot can be simplified.

MODES FOR CARRYING OUT THE DISCLOSURE

Figure 1:
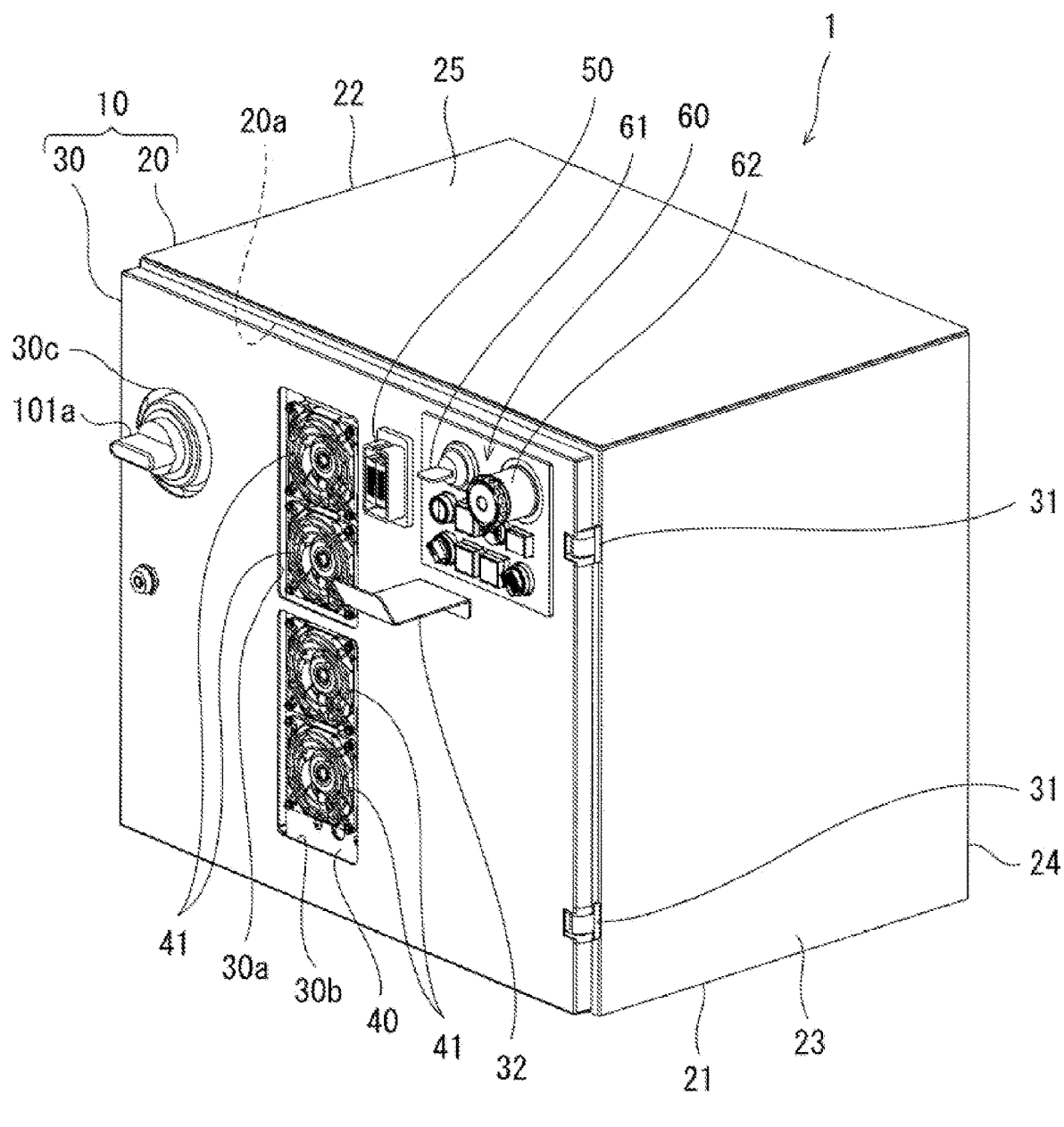
FIG. 1 is a perspective view illustrating one example of a configuration of a robot control device according to one embodiment, when seen from the front.
Figure 1:
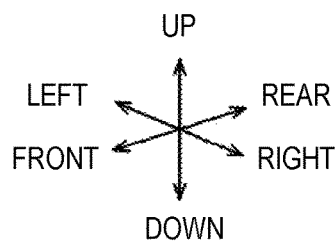

Hereinafter, embodiments of the present disclosure will be described with reference to the drawings. Note that each of the embodiments described below illustrates a comprehensive or concrete example. Components which are not described in the independent claim indicating the top concept among the components in the following embodiments will be described as arbitrary components. Further, each drawing in the accompanying drawings is a schematic drawing and is not necessarily illustrated exactly. Moreover, in each drawing, the same reference characters are assigned to substantially the same components, and therefore, redundant description may be omitted or simplified.

<Configuration of Robot Control Device>

A configuration of a control device 1 for a robot according to one embodiment is described. The robot control device 1 is a control device which controls operation of the robot. The robot to be controlled may be any kind of robot. For example, the robot to be controlled may be various robots, such as an industrial robot, a service robot, construction machinery, a tunnel boring machine, a crane, a cargo vehicle, and a humanoid. The service robot is a robot used in various service industries, such as nursing, medical, cleaning, guard or security, guidance, rescue, cooking, and goods offering services. In this embodiment, the robot to be controlled is described as an industrial robot, such as a vertical articulated robot, a horizontal articulated robot, a polar-coordinate robot, a cylindrical-coordinate robot, and a Cartesian-coordinate robot. Such an industrial robot is provided with servo motors as drive motors for driving joints etc. A servo amplifier used for controlling the servo motor includes a power module which generates heat by being supplied with power.

Figure 2:
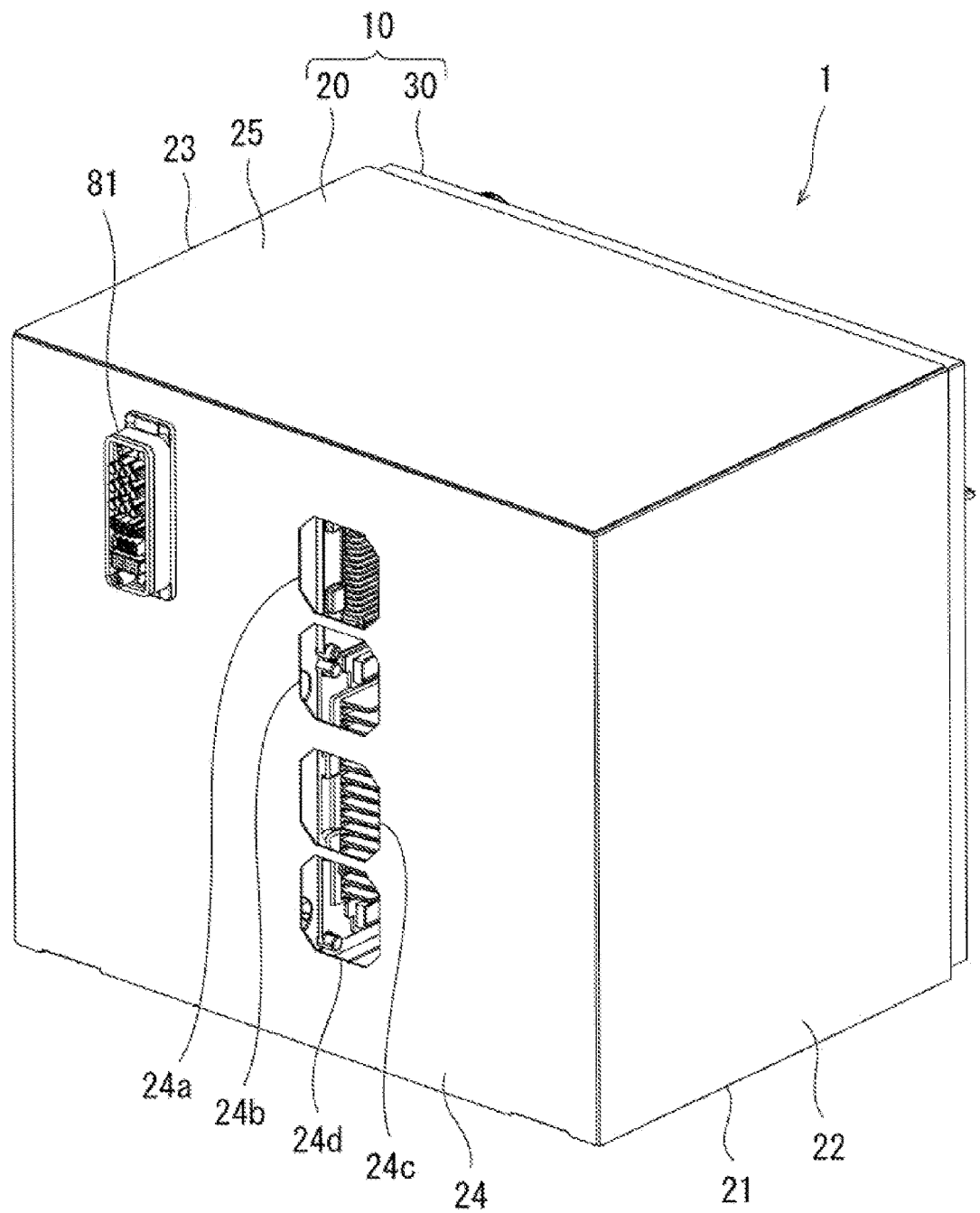
FIG. 2 is a perspective view illustrating the example of the configuration of the robot control device according to this embodiment, when seen from the rear.
Figure 3:
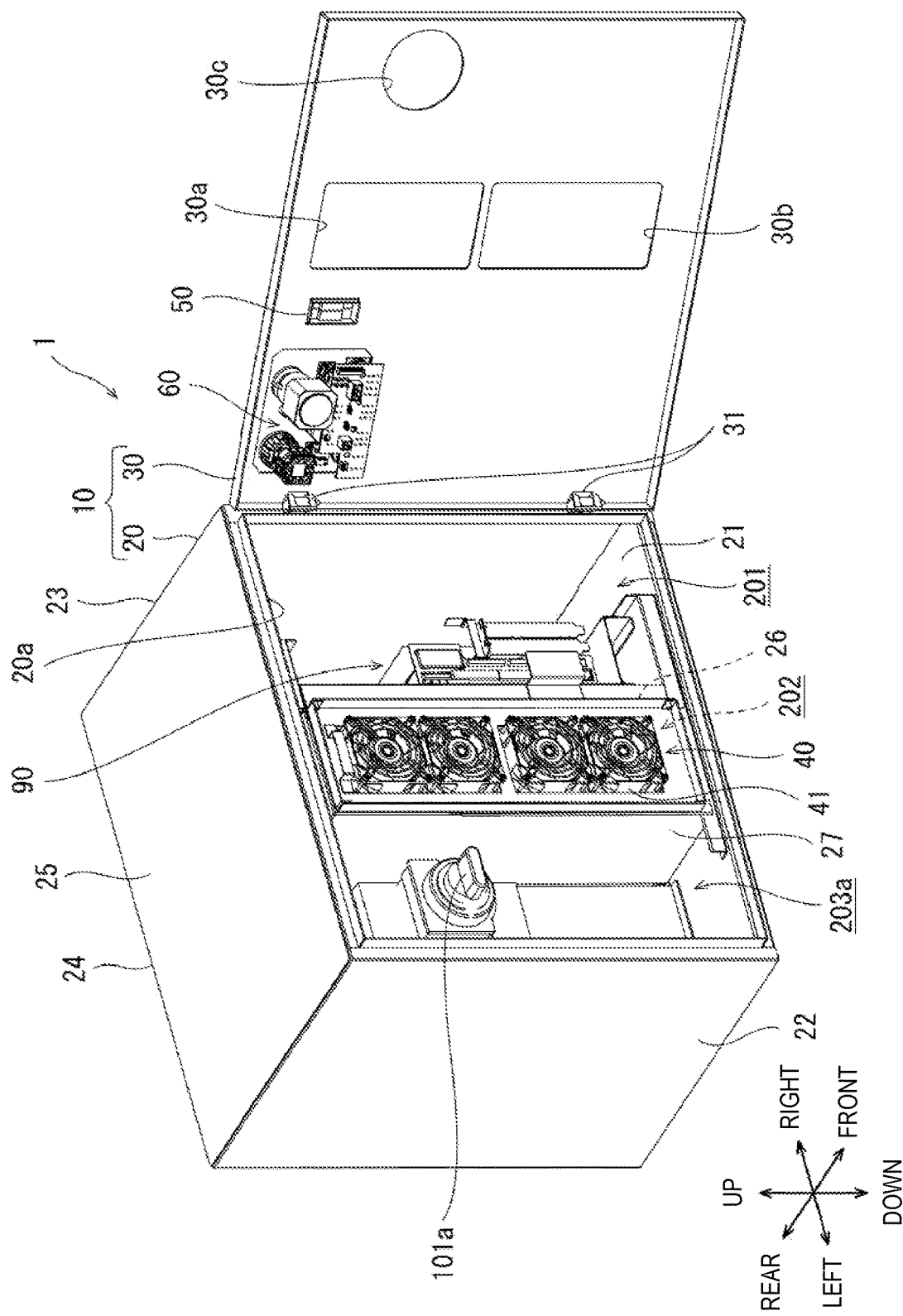
FIG. 3 is a perspective view illustrating the example of the configuration of the robot control device according to this embodiment in a state where a door is opened, when seen from the front.
Figure 4:
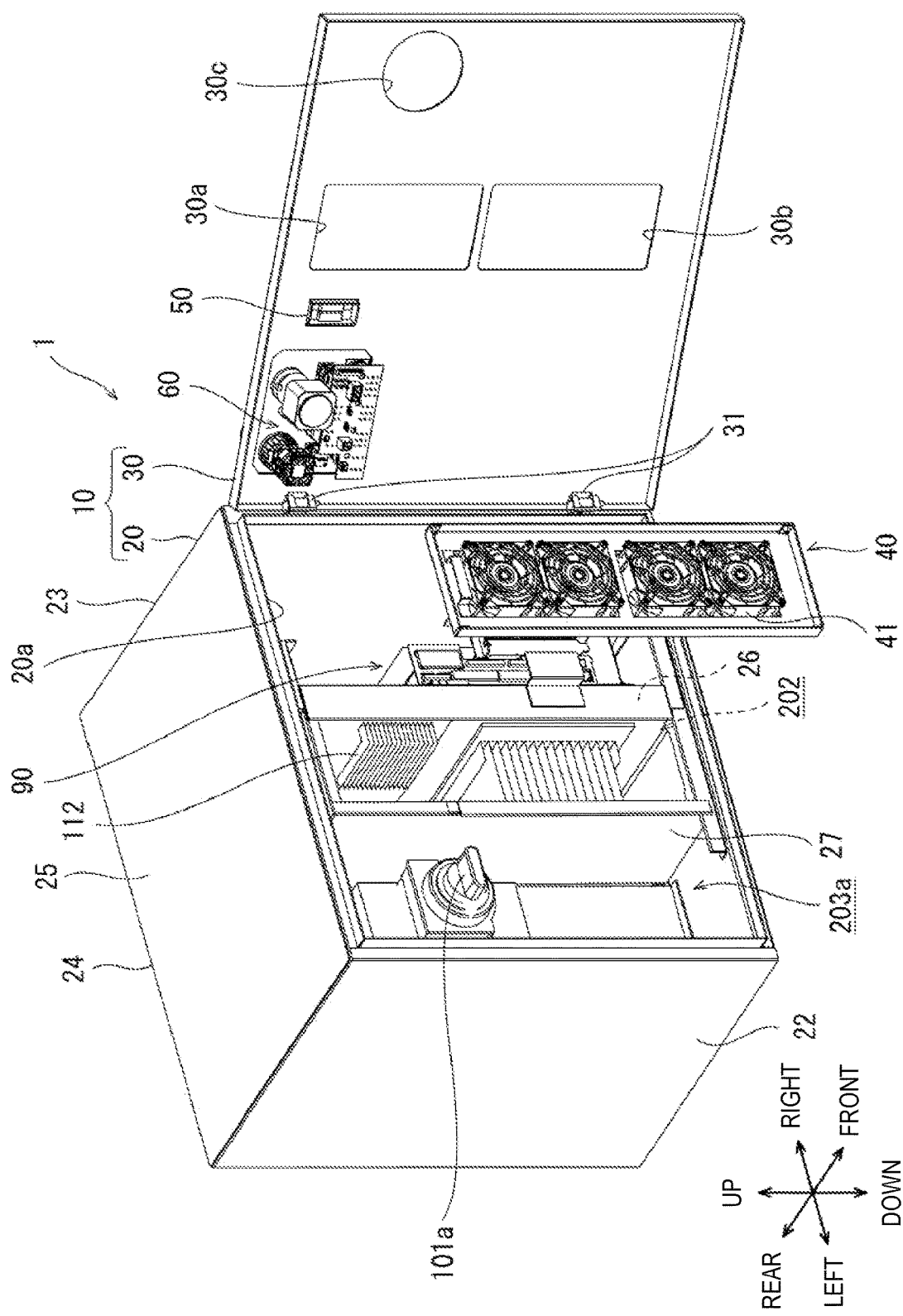
FIG. 4 is a view illustrating the robot control device of FIG. 3 in a state where a blower device is removed.

FIG. 1 is a perspective view illustrating one example of a configuration of the robot control device 1 according to one embodiment, when seen from the front. FIG. 2 is a perspective view illustrating the example of the configuration of the robot control device 1 according to this embodiment, when seen from the rear. FIG. 3 is a perspective view illustrating the example of the configuration of the robot control device 1 according to this embodiment in a state where a door 30 is opened, when seen from the front. FIG. 4 is a view illustrating the robot control device 1 of FIG. 3 in a state where a blower device 40 is removed. Below, the "robot control device" may simply be referred to as a "control device."

As illustrated in FIGS. 1 to 3, the control device 1 is provided with a casing 10. In this embodiment, although the shape of the casing 10 is a rectangular parallelepiped shape, it may be any kind of shape without being limited to the shape. The casing 10 has a main body 20 of the rectangular parallelepiped shape, and the door 30. The main body 20 has a rectangular first opening 20a, and second openings 24a-24d disposed at a side wall 24, which is one example of a wall opposing to the first opening 20a. The door 30 has a rectangular lid shape, and is provided to the main body 20 so as to open and close the first opening 20a. For example, the door 30 is attached to a side wall 23 of the main body 20 via hinges 31 so that it constitutes a single swinging door. The shapes of the main body 20 and the door 30 are not limited to the rectangular parallelepiped shape and the rectangular shape. The main body 20 may have any structure as long as it has the first opening and the second openings disposed at the wall opposing to the first opening, and the door 30 opens and closes the first opening.

The main body 20 includes a bottom wall 21, a top wall 25, and side walls 22-24, and each wall has a rectangular shape. The side walls 22-24 rises from three circumferential edges of the bottom wall 21, and bottom edges of the side walls 22-24 are joined to the circumferential edges of the bottom wall 21. The side walls 22-24 are joined to each other at adjacent side edges. The side walls 22 and 23 oppose to each other, and they are substantially parallel in this embodiment. The top wall 25 is disposed so as to oppose to the bottom wall 21, and in this embodiment, it is substantially parallel to the bottom wall 21. The three circumferential edges of the top wall 25 are joined to upper edges of the side walls 22-24. One of the circumferential edges of the bottom wall 21, one of the circumferential edges of the top wall 25, and one of the side edge of each of the side walls 22 and 23 form the rectangular first opening 20a. The first opening 20a and the side wall 24 oppose to each other.

Here, a direction toward the top wall 25 from the bottom wall 21 is referred to as "above" or "up," and the opposite direction is referred to as "below" or "down." A direction toward the side wall 23 from the side wall 22 is referred to as "right," and the opposite direction is referred to as "left." A direction toward the side wall 24 from the first opening 20a is referred to as "rear," and the opposite direction is referred to as "front." The first opening 20a opens to the front. The second openings 24a-24d open to the rear, and are arrayed in the vertical direction. Note that the number of the second openings 24a-24d is not limited to four as illustrated in FIG. 2.

Further, in the door 30, first door openings 30a and 30b and a second door opening 30c which penetrate the door 30 are formed. The number of the first door openings 30a and 30b is not limited to two as illustrated in FIG. 1. The first door openings 30a and 30b are arrayed in the vertical direction. When the door 30 closes the first opening 20a, the first door openings 30a and 30b and the second door opening 30c communicate the inside of the casing 10 with the outside. Further, the positions of the first door openings 30a and 30b oppose to the positions of the second openings 24a-24d. From the second door opening 30c, a breaker switch 101a projects to the outside of the door 30. The breaker switch 101a is connected to a breaker 101 (not illustrated), and is a switch for switching the breaker 101 between an operating state and a non-operating state. The breaker 101 is a breaker which intercepts a flow of current inside the control device 1 when it operates.

The control device 1 is provided with the blower device 40 at or near the first opening 20a. The blower device 40 is detachably provided to the main body 20. The blower device 40 is provided with a fan 41 and it is not limited to this configuration, but in this embodiment, it is provided with four fans 41 arrayed in the vertical direction. The four fans 41 are disposed so that they are adjacent to the first door openings 30a and 30b in the front-and-rear direction when the door 30 closes the first opening 20a (that is, they face the first door openings 30a and 30b). Therefore, the four fans 41 are disposed at or near the first door openings 30a and 30b. The four fans 41 forcibly introduce, by driving, outside air into the casing 10 through the first door openings 30a and 30b or the second openings 24a-24d, and forcibly discharge the air inside the casing 10 to the outside through the second openings 24a-24d or the first door openings 30a and 30b.

The control device 1 is provided at the door 30 with a holding member 32, a manipulator connector 50, and a manipulation panel 60. The manipulator connector 50 is one example of a connecting device, and is configured to be physically and electrically connected to the a communication connector of a manipulator of the robot (not illustrated). The control device 1 communicates a signal, current, etc. with the manipulator via the manipulator connector 50. The holding member 32 holds the manipulator of the robot. For example, the holding member 32 is configured so that the manipulator is hooked thereon. For example, the manipulator may be a manipulator for teaching (instructing) the robot, or may be other manipulators.

The manipulation panel 60 is a panel for adjusting controlled parameters of the control device 1. For example, in the manipulation panel 60, a mode setting device 61 for setting the operating mode of the robot and an emergency stopping device 62 of the robot are disposed. In the manipulation panel 60, indication lights and a display device, such as a display, for displaying various information, and an adjuster for adjusting output may be disposed, for example. The emergency stopping device 62 of the robot is a device for stopping the robot when it operates, and may be an input device, such as a switch, for inputting an emergency stop command.

The mode setting device 61 may be an input device, such as a changeover switch, for setting the operating mode. The operating mode to be set may include at least one of a teaching mode, a manual operation mode, an automatic operation mode, and a correctable automatic operation mode. The teaching mode is an operating mode for teaching operation, such as a work, to the robot, and, for example, is an operating mode for programming operation to the robot by an operator manually operating the robot using the manipulator. The manual operation mode is an operating mode for manually manipulating the robot by using the manipulator, and is an operating mode for causing the robot to perform operation according to manipulation inputted into the manipulator by the operator (i.e., operation tracing the manipulation). The automatic operation mode is an operating mode for automatically operating the robot, and is an operating mode for causing the robot to automatically perform operation, such as a work, according to a program set by teaching etc. The correctable automatic operation mode is an operating mode for accepting manual operation while the robot performs the automatic operation. For example, in the correctable automatic operation mode, the automatic operation and the manual operation may be combined, or a correction to the operation by the manual operation may be accepted during the automatic operation.

Note that, in the door 30, at least one of the breaker switch 101a, the manipulator connector 50, the mode setting device 61, and the emergency stopping device 62 of the robot may be disposed.

The control device 1 is provided at the side wall 24 of the main body 20 with a robot connector 81 (see FIG. 2). The robot connector 81 is configured to be physically and electrically connected to a communication connector (not illustrated) of the robot. The control device 1 communicates a signal, current, etc. with the robot via the robot connector 81.

The control device 1 is configured so that an electric wire extending from an external power source (may also be referred to as a "primary power source") (not illustrated) is connected to the breaker 101 (described later). The control device 1 is supplied with current etc. from the external power source. The breaker 101 intercepts, by being activated, the supply of current from the external power source to the control device 1.

Figure 5:
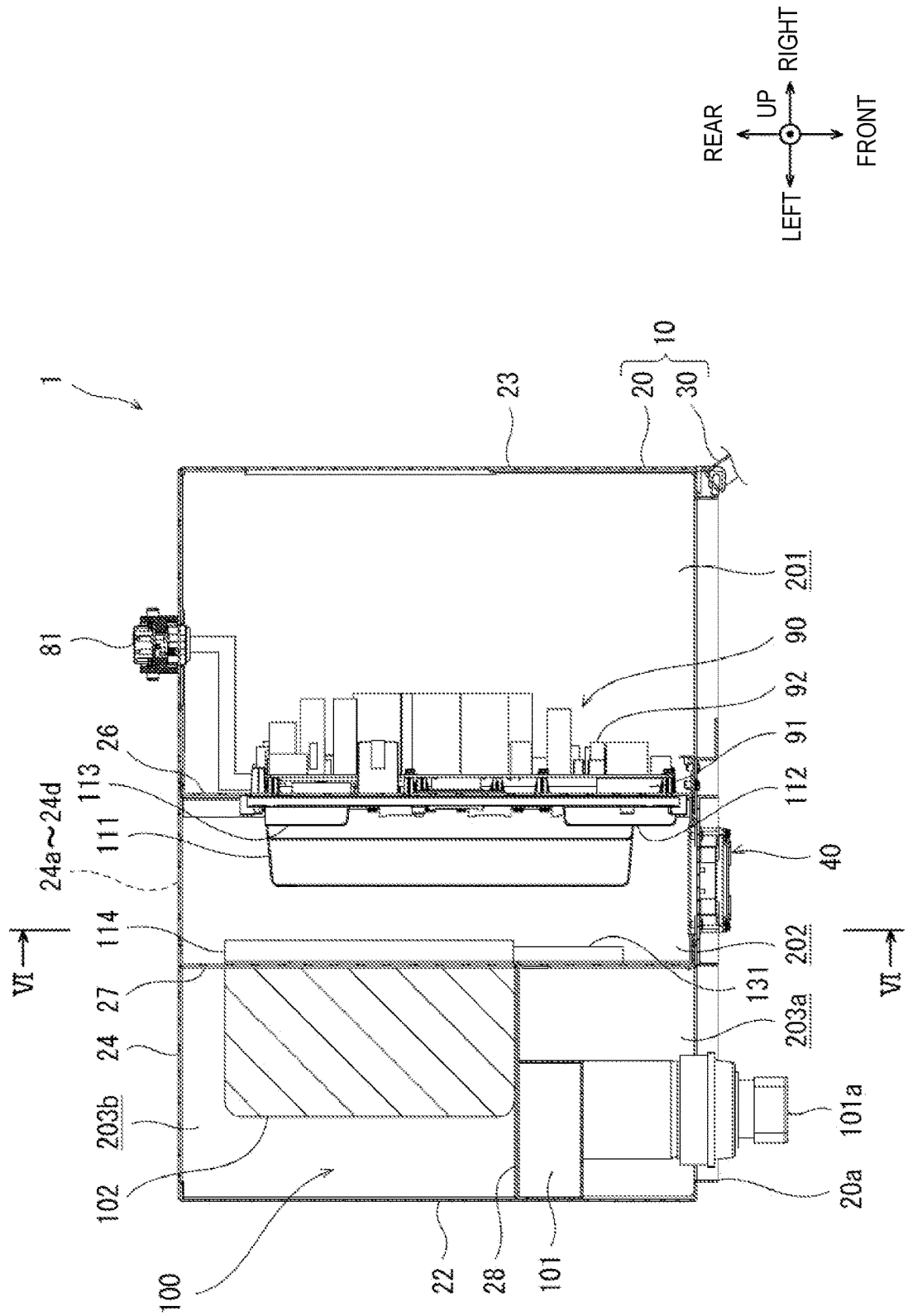
FIG. 5 is a plan view illustrating one example of the robot control device of FIG. 3, when the inside is seen downwardly from above.

FIG. 5 is a plan view illustrating one example of the inside of the robot control device 1 of FIG. 3, when seen downwardly from above. As illustrated in FIGS. 3 to 5, the main body 20 has partition walls 26 and 27 which partition an interior space thereof. The partition walls 26 and 27 extend in the front-and-rear direction and the vertical direction, and partition the interior space of the main body 20 in the left-and-right direction. The partition walls 26 and 27 extend along the side walls 22 and 23, and in this embodiment, they are substantially parallel to the side walls 22 and 23. A first chamber 201 is formed between the side wall 23 and the first partition wall 26. A second chamber 202 is formed between the partition walls 26 and 27. Third chambers 203a and 203b are formed between the side wall 22 and the second partition wall 27.

The first chamber 201 is surrounded by the bottom wall 21, the side walls 23 and 24, the top wall 25, and the first partition wall 26, and opens at the first opening 20a. The second chamber 202 is surrounded by the bottom wall 21, the side wall 24, the top wall 25, and the partition walls 26 and 27, and opens at the first opening 20a and the second openings 24a-24d. The blower device 40 is disposed in the second chamber 202, at or near the first opening 20a.

The third chambers 203a and 203b are surrounded by the bottom wall 21, the side walls 22 and 24, the top wall 25, and the second partition wall 27. The third chambers 203a and 203b are lined up in the front-and-rear direction, and are partitioned by a third partition wall 28. The third chamber 203a is open at the first opening 20a, and the third chamber 203b is closed by the third partition wall 28. Note that the third partition wall 28 may be configured to be detachably attached to the main body 20. When necessary, by removing the third partition wall 28, it is possible to access the third chamber 203b through the first opening 20a, and when unnecessary, by attaching the third partition wall 28, it is possible to limit the access to the third chamber 203b.

When the door 30 closes the first opening 20a, it closes the first chamber 201, communicates the second chamber 202 with the outside via the first door openings 30a and 30b, and closes the third chamber 203a. For example, a sealing member, such as packing, may be disposed around the first chamber 201 at the first opening 20a, in detail, the edges of the bottom wall 21, the side wall 23, the top wall 25, and the first partition wall 26. Therefore, the first chamber 201 can increase airtightness or the fluidtightness by the door 30 and the sealing member so that it can suppress entering of foreign materials, such as particulates and dusts. The sealing member, such as packing, may be disposed at the edges of the bottom wall 21, the side wall 22, the top wall 25, and the second partition wall 27, and the inner circumference of the second door opening 30c. Thus, the third chamber 203a can increase the airtightness or the fluidtightness by the door 30 and the sealing member so that it can suppress the entering of foreign materials, such as particulates and dusts.

Further, the control device 1 includes a first circuit 90 disposed inside the first chamber 201, heat sinks 111-114 disposed inside the second chamber 202, and a second circuit 100 disposed inside the third chambers 203a and 203b. The first circuit 90 is a circuit for controlling the drive of the robot. The first circuit 90 includes a servo amplifier 91 and a power unit 92. The servo amplifier 91 controls the servo motor by controlling current supplied to the servo motor (not illustrated) of the robot. The servo amplifier 91 may also include a power module for controlling current supplied to the servo motor. The power unit 92 supplies electric power supplied from the external power source (not illustrated) to each part of the control device 1. The power unit 92 may also include a rectifier circuit or an AC/DC circuit which converts AC power into DC power. The servo amplifier 91 generates heat when power is supplied. The power unit 92 includes a capacitor, and generates heat when power is supplied. The servo amplifier 91 is one example of a first heat generating element, and the power unit 92 is one example of a second heat generating element.

Note that the servo motor includes an electric motor, an encoder which detects a rotation angle of a rotator of the electric motor, and a current sensor which detects a current value of the electric motor. The servo motor operates the electric motor according to the current outputted from the servo amplifier 91, and outputs detection values of the encoder and the current sensor to the servo amplifier 91. The servo amplifier 91 detects a rotated amount, a rotational speed, etc. of the rotator of the servo motor based on the detection value of the encoder fed back from the servo motor, and controls a rotation start, a rotation stop, a rotational speed, and a rotational torque of the servo motor by using the detection results, such as the rotated amount and the rotational speed of the rotator, and the current value of the current sensor. Thus, the servo amplifier 91 can stop the servo motor at an arbitrary rotational position, can rotate it at an arbitrary rotational speed, and can operate it at an arbitrary rotational torque. Therefore, each part of the robot which is driven by the servo motor can operate variously and precisely.

The second circuit 100 is an electric circuit and includes the breaker 101 and a transformer 102. The breaker 101 is disposed in the third chamber 203a, and the transformer 102 is disposed in the third chamber 203b. The breaker 101 and the transformer 102 are connected electrically, and the breaker 101 intercepts current supplied to the transformer 102 when it operates. The transformer 102 transforms electric power supplied from the external power source via the breaker 101, and supplies it to the power unit 92 of the first circuit 90. The transformer 102 generates heat when power is supplied. Note that, in the third chamber 203b, other electric circuits may be disposed, in addition to or instead of the transformer 102.

The heat sinks 111-113 are disposed at the first partition wall 26, and the heat sink 114 is disposed at the second partition wall 27. The heat sinks 111-114 are made of a material with high thermal conductivity. For example, the heat sinks 111-114 may be made of a metal with high thermal conductivity, such as aluminum, iron, and copper.

Figure 6:
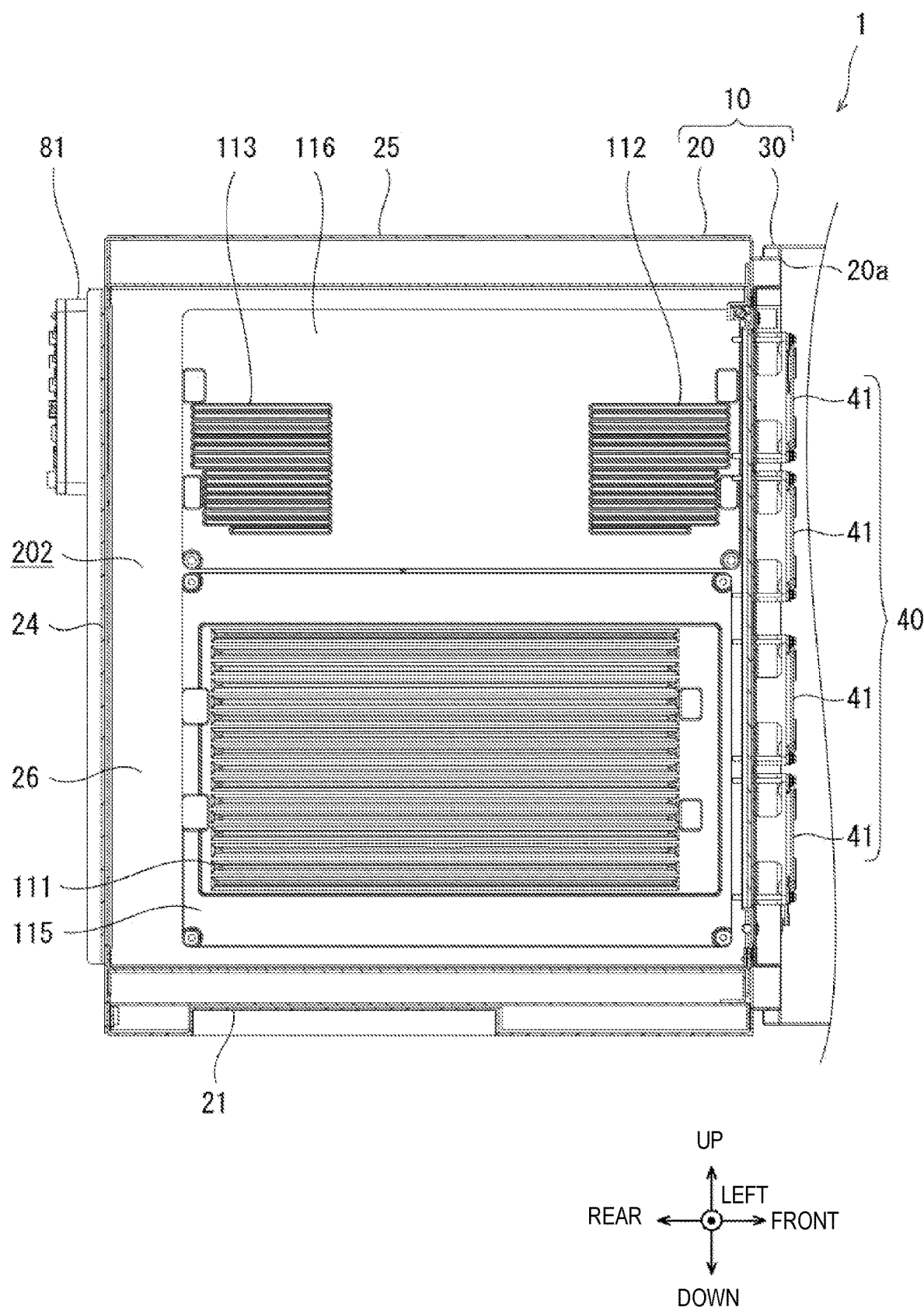
FIG. 6 is a cross-sectional view of the robot control device of FIG. 5, taken along a line VI-VI.

FIG. 6 is a cross-sectional view of the robot control device 1 of FIG. 5, taken along a line VI-VI. As illustrated in FIG. 6, the heat sink 111 is disposed at the first partition wall 26 via a supporting plate 115. The heat sink 111 is attached to the supporting plate 115. The supporting plate 115 is attached to the first partition wall 26, and closes an opening (not illustrated) formed in the first partition wall 26. The heat sink 111 is exposed to the first chamber 201 and the second chamber 202. In the first chamber 201, it is configured so that heat of the servo amplifier 91 of the first circuit 90 is transferred to the heat sink 111. For example, the heat sink 111 is disposed adjacent to the servo amplifier 91 via a thin insulating member (not illustrated).

Further, the heat sink 111 integrally includes a plurality of heat sinks which project to the second chamber 202, and contacts air inside the second chamber 202 via the plurality of heat sinks to exchange heat. Therefore, the heat sink 111 can radiate the heat of the servo amplifier 91 to the second chamber 202. Moreover, the heat sink 111 can increase the area for exchanging the heat by the plurality of heat sinks. Note that the supporting plate 115 may be made of a material with high thermal conductivity, similarly to the heat sink 111. The supporting plate 115 and the heat sink 111 may be made of the same material, and may be integrated. Therefore, the area for radiating the heat of the servo amplifier 91 to the second chamber 202 can be increased. Further, a reduction of the number of components is possible.

The heat sinks 112 and 113 are disposed at the first partition wall 26 via a supporting plate 116, above the heat sink 111. That is, the heat sinks 112 and 113 and the heat sink 111 are lined up in a direction which intersects with a direction from the first door openings 30a and 30b toward the second openings 24a-24d which is a direction of air flow caused by the blower device 40 (air-flow direction). The heat sinks 112 and 113 are attached to the supporting plate 116. The supporting plate 116 is attached to the first partition wall 26, and closes an opening (not illustrated) formed in the first partition wall 26. The heat sinks 112 and 113 are exposed to the first chamber 201 and the second chamber 202. In the first chamber 201, the heat sinks 112 and 113 are configured so that heat of the power unit 92 of the first circuit 90 is transferred thereto. For example, the heat sinks 112 and 113 are disposed adjacent to the power unit 92 via a thin insulating member (not illustrated).

Further, each of the heat sinks 112 and 113 integrally includes a plurality of heat sinks which project in the second chamber 202, and contacts air inside the second chamber 202 via the plurality of heat sinks to exchange heat. Therefore, the heat sinks 112 and 113 can radiate the heat of the power unit 92 to the second chamber 202. In addition, each of the heat sinks 112 and 113 can increase the area for exchanging the heat by the plurality of heat sinks. Note that the supporting plate 116 may be made of a material with high thermal conductivity. Further, the supporting plate 116 and the heat sinks 112 and 113 may be made of the same material, and may be integrated. Therefore, the area for radiating the heat of the power unit 92 to the second chamber 202 can be increased. Further, a reduction of the number of components is possible.

Returning to FIG. 5, the heat sink 114 is disposed at the second partition wall 27. The heat sink 114 is disposed at the opposite side of the heat sinks 111-113 in the second chamber 202. The heat sink 114 may be disposed at the second partition wall 27 via a supporting plate (not illustrated) which closes an opening (not illustrated) formed in the second partition wall 27, similarly to the heat sinks 111-113. The heat sink 114 is exposed to the second chamber 202 and the third chamber 203b. In the third chamber 203b, it is configured so that heat of the transformer 102 is transferred to the heat sink 114. For example, the heat sink 114 is disposed adjacent to the transformer 102 via a thin insulating member (not illustrated).

Further, the heat sink 114 integrally includes a plurality of heat sinks which project in the second chamber 202, and contacts air inside the second chamber 202 via the plurality of heat sinks to exchange heat. Therefore, the heat sink 114 can radiate the heat of the transformer 102 to the second chamber 202. Further, the heat sink 114 can increase the area for exchanging heat by the plurality of heat sinks. Note that the supporting plate (not illustrated) which supports the heat sink 114 may be made of a material with high thermal conductivity, and, further, may be made of the same material as the heat sink 114, and may be integrated therewith. Therefore, the area for radiating the heat of the transformer 102 to the second chamber 202 can be increased. Further, a reduction of the number of components is possible.

Moreover, the control device 1 may be provided with a resistor 131 disposed at the second partition wall 27. The resistor 131 is exposed to the second chamber 202. The resistor 131 is an electrical resistive element which generates heat by being supplied with power. The resistor 131 is electrically connected to the first circuit 90, and is configured to consume surplus power from the first circuit 90. The resistor 131 consumes the supplied electric power by generating heat. The resistor 131 radiates the generated heat by contacting air inside the second chamber 202 and exchanging heat therewith. For example, the servo motor of the robot may regenerate power, and the regenerated power may be supplied to the first circuit 90 and may become the excessive electric power. The first circuit 90 supplies the excessive electric power to the resistor 131 in order to protect the circuit.

<Operation of Control Device>

Operation of the control device 1 according to this embodiment is described. As illustrated in FIGS. 1 and 2, the door 30 of the casing 10 of the control device 1 is closed in a normal state including a use state where the robot (not illustrated) is controlled. At this time, the first chamber 201, and the third chambers 203a and 203b of the casing 10 are closed. The second chamber 202 is open to the outside of the casing 10 via the first door openings 30a and 30b, the first opening 20a, and the second openings 24a-24d.

As illustrated in FIGS. 5 and 6, when the control device 1 is used, the control device 1 is supplied with power and, thereby, the first circuit 90 and the second circuit 100 are supplied with power. The first circuit 90 activates the blower device 40. Further, the first circuit 90 drives the servo amplifier 91 and the power unit 92 to operate the robot (not illustrated) electrically connected to the control device 1. In detail, the first circuit 90 drives the servo motor to operate joint(s), end effector(s) (not illustrated) of the arm of the robot, for example.

The fans 41 of the blower device 40 rotate in one direction to forcibly generate an air flow from the front of the casing 10 toward the rear. That is, the fans 41 generate the air flow which flows into the second chamber 202 through the first door openings 30a and 30b and the first opening 20a, and flows out of the second chamber 202 through the second openings 24a-24d. Therefore, the second chamber 202 constitutes a linear passage for the gas from the first door openings 30a and 30b toward the second openings 24a-24d. Note that the fans 41 may rotate in the opposite direction to the one direction. In this case, inside the second chamber 202, an air flow from the second openings 24a-24d toward the first door openings 30a and 30b is generated.

By the fans 41, outside air is forcibly introduced into the second chamber 202 and then forcibly discharged. The introduced outside air contacts the heat sinks 111-114 and exchange heat to absorb the heat. Therefore, the heat of the servo amplifier 91 and the power unit 92 of the first circuit 90 is absorbed by the outside air via the heat sinks 111-113. Further, the heat of the transformer 102 of the second circuit 100 is absorbed by the outside air via the heat sink 114. Moreover, the outside air contacts the resistor 131 and exchanges heat to absorb the heat.

The heat sink 111 which absorb heat from the servo amplifier 91, and the heat sinks 112 and 113 which absorb heat from the power unit 92 are disposed in the casing 10 so as to be separated in the vertical direction. The heat sink 111 and the heat sinks 112 and 113 are not disposed in an upstream or downstream spatial relationship of the outside air flow generated by the blower device 40, but are disposed in a direction which intersects with the direction of the outside air flow. The outside air with which the heat sink 111 exchanges heat is not outside air after a heat exchange with the heat sink 112 or 113, but is fresh outside air introduced from the outside of the casing 10. The outside air with which the heat sinks 112 and 113 exchange heat is not outside air after a heat exchange with the heat sink 111, but is fresh outside air introduced from the outside of the casing 10. Therefore, the heat exchange by the heat sinks 111-113 is possible with high efficiency. Note that, in FIG. 6, although the heat sink 113 is located downstream of the heat sink 112 in the flow of the outside air inside the second chamber 202, it may be disposed above or below this location so that fresher outside air can be introduced into the heat sink 113.

The heat sink 114 is disposed at the opposite side of the heat sinks 111-113 with respect to the second chamber 202, in the left-and-right direction of the casing 10 (i.e., the direction perpendicular to the outside air flow). The outside air with which the heat sink 114 exchanges heat is outside air having low influence by the heat exchange of the heat sinks 111-113. Therefore, the heat exchange by the heat sink 114 is possible with high efficiency.

Further, the first chamber 201 and the third chambers 203a and 203b are shielded from the second chamber so that they do not accept the forcible introduction of outside air. For this reason, entering of the foreign materials into the first chamber 201 and the third chambers 203a and 203b is suppressed.

Further, the inlet and the outlet of the outside air are limited to the door 30 at the front of the casing 10, and the side wall 24 at the rear. Moreover, the holding member 32, the manipulator connector 50, the manipulation panel 60, and the breaker switch 101a are disposed at the door 30, and the robot connector 81 is disposed at the side wall 24. For this reason, other devices, such as other control devices 1, can be disposed around the casing 10 so as to be adjacent to the bottom wall 21, the side walls 22 and 23, and the top wall 25. For example, a plurality of control devices 1 may be disposed so as to be stacked in the vertical direction and the left-and-right direction.

Further, as illustrated in FIGS. 3 and 5, the door 30 of the casing 10 is opened in a non-normal state including a maintenance state of the control device 1. Only by opening the single door 30, one can access the first chamber 201, the second chamber 202, and the third chambers 203a and 203b through the first opening 20a. For example, it is possible to inspect, repair, and replace the first circuit 90, the blower device 40, and the breaker 101. Further, an inspection etc., inside the third chamber 203b is possible by removing the third partition wall 28.

Effects Etc

The robot control device 1 according to this embodiment as described above includes the main body 20 having the first opening 20a, and the second openings 24a-24d disposed at the side wall 24 opposing to the first opening 20a, the casing 10 having the door 30 provided to the main body 20 so as to open and close the first opening 20a, the first circuit 90 including the servo amplifier 91 as the heat generating element which generates heat by being supplied with power, and at least one blower device 40. The main body 20 has the first chamber 201 which accommodates the first circuit 90 and is open at the first opening 20a, and the second chamber 202 which is adjacent to the first chamber 201 via the first partition wall 26 and is open at the first opening 20a and the second openings 24a-24d. The door 30 has the first door openings 30a and 30b which penetrate the door 30 and are disposed so as to be communicatable with the second chamber 202. When the door 30 closes the first opening 20a, it closes the first chamber 201 and communicates the second chamber 202 with the outside via the first door openings 30a and 30b. The at least one blower device 40 is disposed at at least one of the position of the first door openings 30a and 30b, the position near the first door openings 30a and 30b, the position of the second openings 24a-24d, and the position near the second openings 24a-24d, and it is configured to introduce and discharge air into/from the second chamber 202. For example, in this embodiment, the blower device 40 is disposed at or near the first door openings 30a and 30b.

According to the above configuration, when the door 30 closes the first opening 20a, the inflow and the outflow of the outside air into/from the second chamber 202 are possible. Therefore, via the first partition wall 26, the heat exchange of the outside air inside the second chamber 202, with the air inside the first chamber 201 and the first circuit 90 is possible so that the heat of the servo amplifier 91 is discharged to the second chamber 202, for example. Further, by the blower device 40 introducing or discharging the air, it becomes possible to increase the heat exchanging amount of the air inside the second chamber 202.

Since the blower device 40 is disposed at the end part of the second chamber 202, it is possible to effectively use the space inside the second chamber 202. Further, when the blower device 40 is disposed at or near the first door openings 30a and 30b, it is possible to access the blower device 40 from the door 30 side. For example, when the door 30 opens the first opening 20a, the inspection, repair, replacement, etc. of the blower device 40 are easy.

Further, since the first chamber 201 is closed when the door 30 closes the first opening 20a, entering of the foreign materials into the first circuit 90 is suppressed. Moreover, when the door 30 opens the first opening 20a, it is possible to access the first chamber 201 and the second chamber 202 from the outside. The inspection, repair, replacement, etc. of the first circuit 90 are possible. Such a control device 1 can implement the above functions by the simple structure.

Moreover, in this embodiment, the first opening 20a and the second openings 24a-24d may be disposed at the positions opposing to each other. According to this configuration, the second chamber 202 which uses the first opening 20a or the second openings 24a-24d as the inlet and the outlet can form a linear passage for air therein. Therefore, since it becomes possible to make the air flow inside the second chamber 202 smooth, the heat exchanging efficiency with the air improves. Further, when the first opening 20a is located in the front part of the casing 10, the second openings 24a-24d are located in the rear part of the casing 10. Therefore, it is possible to dispose other objects at the sides of the casing 10 and above and below the casing 10. For example, it is possible to dispose the casing 10 so as to be stacked vertically and horizontally. Therefore, the disposed space of the control device 1 can be reduced.

Further, in this embodiment, the control device 1 may be provided with first heat sinks 111-113 disposed at the first partition wall 26, and the first heat sinks 111-113 may be disposed so that they contact the air inside the second chamber 202, and the heat of the servo amplifier 91 and the power unit 92 of the first circuit 90 is transferable thereto. According to this configuration, the heat of the servo amplifier 91 and the power unit 92 is transferred to the first heat sinks 111-113, and the transferred heat exchanges heat with the air inside the second chamber 202 which contacts the first heat sinks 111-113 and is absorbed. The first heat sinks 111-113 can effectively absorb the heat of the servo amplifier 91 and the power unit 92, and can effectively radiate the heat to the air inside the second chamber 202. Therefore, an improvement in the heat exchanging efficiency is possible.

Moreover, in this embodiment, the first circuit 90 may include the servo amplifier 91 and the power unit 92, and at least two first heat sinks 111-113 may be disposed so that the heat of the servo amplifier 91 and the power unit 92 is transferable thereto. Further, the first heat sink 111 to which the heat of the servo amplifier 91 can be transferred, and the first heat sinks 112 and 113 to which the heat of the power unit 92 can be transferred may be disposed in a direction which intersects with the flow direction of the air generated in the second chamber 202 by the blower device 40. According to this configuration, it is suppressed that the air after exchanging the heat with the first heat sink 111 exchanges the heat with the first heat sinks 112 and 113. It is suppressed that the air after exchanging the heat with the first heat sinks 112 and 113 exchanges the heat with the first heat sink 111. Therefore, all of the first heat sink 111 and the first heat sinks 112 and 113 can exchange heat with fresh air. Therefore, an improvement in the heat exchanging efficiency is possible.

Further, in this embodiment, the control device 1 may include the second circuit 100 in the third chambers 203a and 203b provided to the main body 20, and the third chambers 203a and 203b may be adjacent to the second chamber 202 via the second partition wall 27. According to this configuration, it is possible to exchange heat, via the second partition wall 27, between the air inside the second chamber 202, the air inside the third chambers 203a and 203b, and the second circuit 100, and the heat of the second circuit 100 is discharged to the second chamber 202. Therefore, it is possible to discharge the heat inside the first chamber 201 and the third chambers 203a and 203b by using one second chamber 202. Therefore, a simplification of the structure of the control device 1 is possible. Note that the third chambers 203a and 203b may be disposed at the opposite side of the first chamber 201 with respect to the second chamber 202. Since the first chamber 201, the second chamber 202, and the third chambers 203a and 203b are lined up, a downsizing of the casing 10 is possible.

Further, in this embodiment, the control device 1 may be provided with the second heat sink 114 disposed at the second partition wall 27, and the second heat sink 114 may be disposed so that it contacts with the air inside the second chamber 202 and the heat of the second circuit 100 is transferable thereto. According to this configuration, the second heat sink 114 can effectively absorb the heat of the second circuit 100, and can effectively radiate the heat to the air inside the second chamber 202. Therefore, an improvement in the heat exchanging efficiency is possible.

Moreover, in this embodiment, the third chamber 203a may be open at the first opening 20a, and when the door 30 closes the first opening 20a, it may be closed by the door 30. According to this configuration, since the third chambers 203a and 203b are closed when the door 30 closes the first opening 20a, entering of the foreign materials into the second circuit 100 is suppressed. Further, when the door 30 opens the first opening 20a, it is possible to access the third chambers 203a and 203b from the outside.

Moreover, in this embodiment, the control device 1 may be provided in the door 30 with at least one of the breaker switch 101a, the manipulator connector 50 as the connecting device with the manipulator of the robot, the mode setting device 61 for the operating mode of the robot, and the emergency stopping device 62 of the robot. According to this configuration, the devices of the control device 1 which the operator operates are disposed at the door 30, and therefore, the devices may be further integrated. Therefore, the control device 1 may be disposed in any way as long as spaces at the front of the door 30 and the rear of the side wall 24 are secured. It is possible to effectively use the spaces at the sides, and up and down of the control device 1, and to reduce the disposed space of the control device 1.

Modification

A control device 1A for the robot according to one modification of the embodiment is described. The robot control device 1A according to this modification differs from the above embodiment in that an electric cable extending from the first circuit 90 passes through the second chamber 202 of the casing 10. Below, as for the modification, the differences from the above embodiment are mainly described, and the description similar to the above embodiment is suitably omitted.

Figure 7:
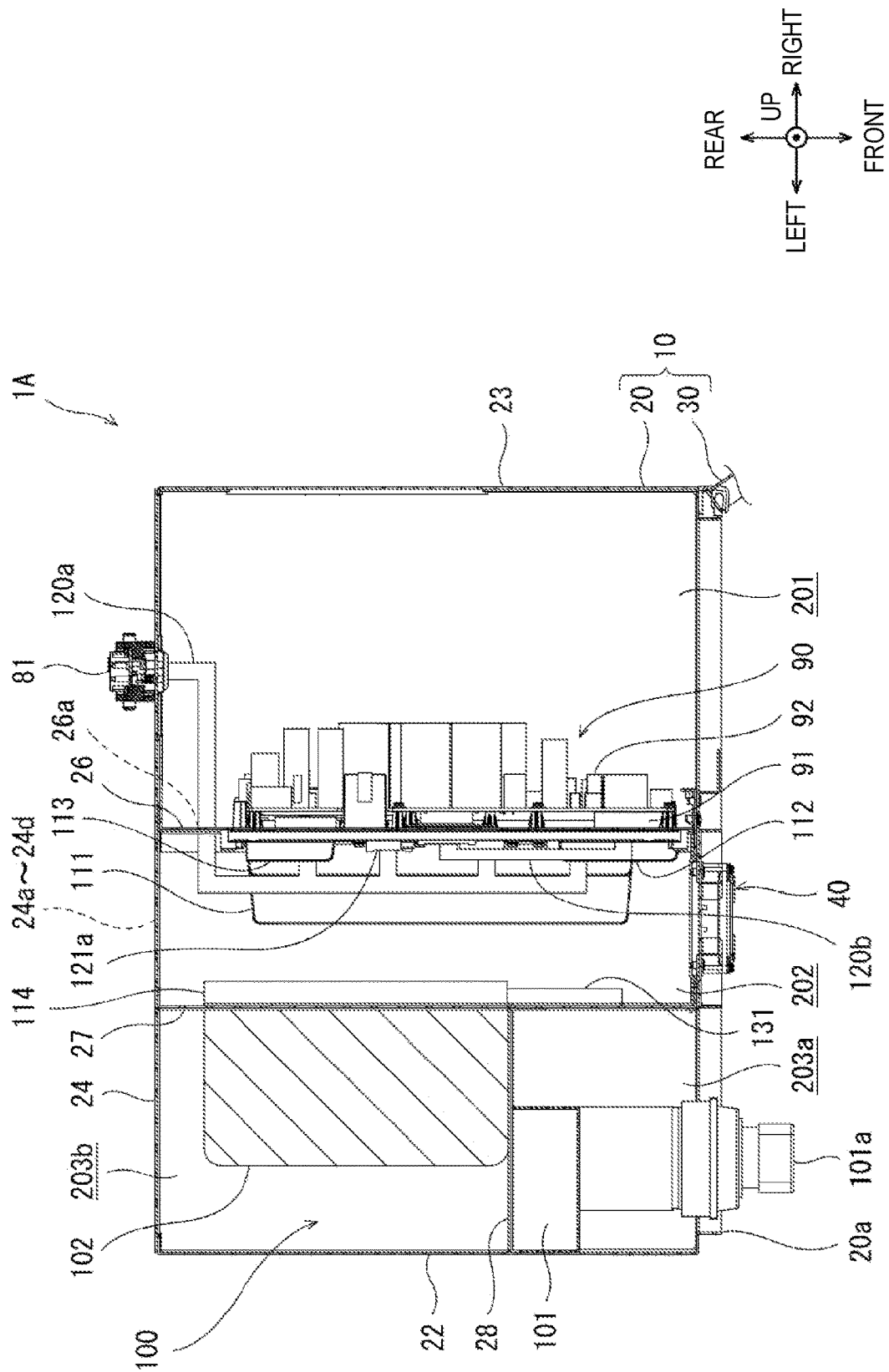
FIG. 7 is a view illustrating one example of a configuration of a robot control device according to a modification, similarly to FIG. 5.
Figure 8:
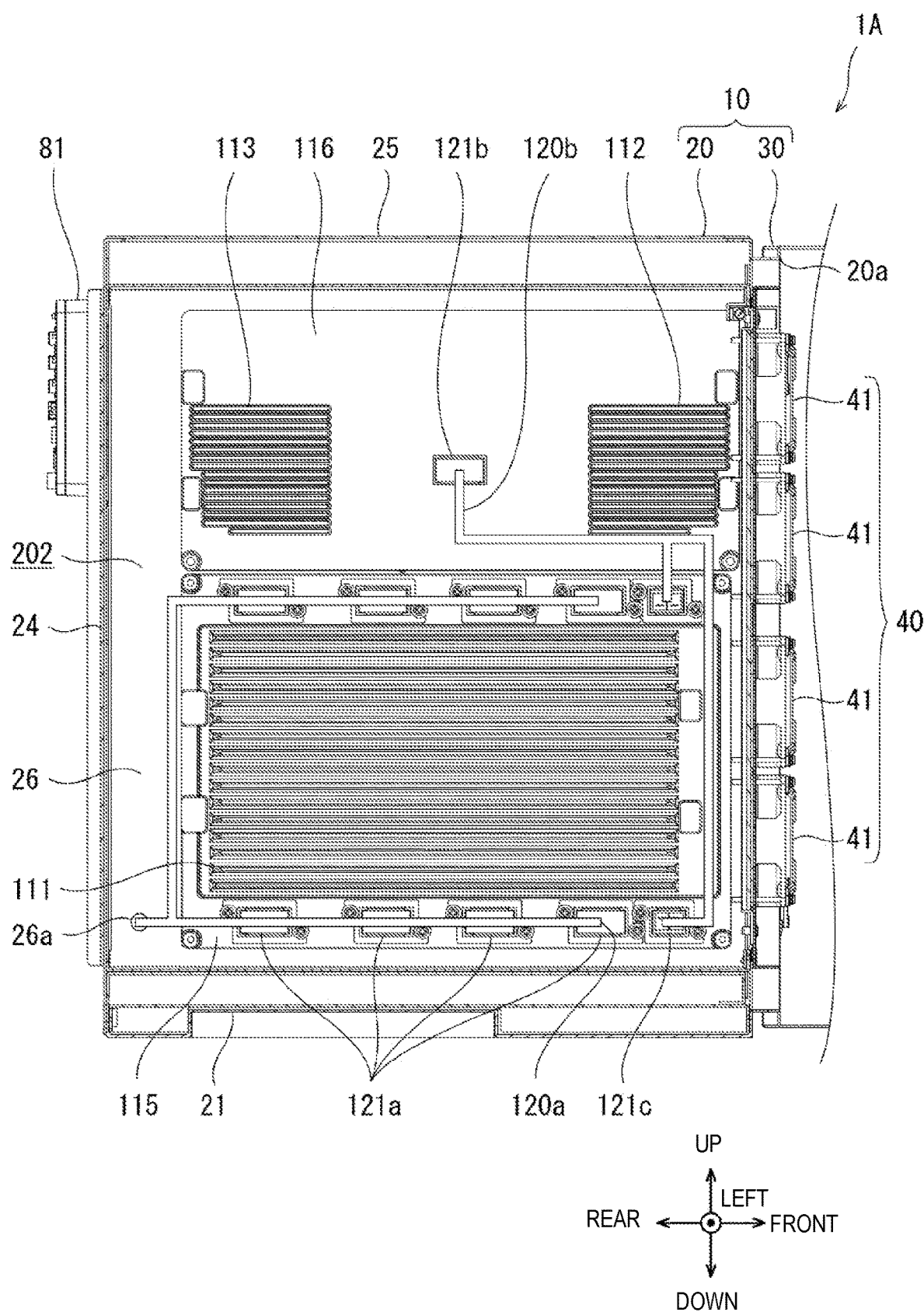
FIG. 8 is a view illustrating the example of the configuration of the robot control device according to this modification, similarly to FIG. 6.

FIG. 7 is a view illustrating one example of the configuration of the robot control device 1A according to the modification, similarly to FIG. 5. FIG. 8 is a view illustrating one example of the configuration of the robot control device 1A according to the modification, similarly to FIG. 6. As illustrated in FIGS. 7 and 8, a plurality of electric cables 120a extend from the servo amplifier 91. The number of electric cables 120a corresponds to the number of robotic arms and the number of servo motors of the end effector. The plurality of electric cables 120a pass through a plurality of insulating holding members 121a which penetrate the supporting plate 115, and extend into the second chamber 202 from the first chamber 201. The electric cables 120a inside the second chamber 202 extend into the first chamber 201 through an opening 26a formed in the first partition wall 26, and are connected to the robot connector 81. Note that a sealing member, such as packing, for increasing the airtightness or the fluidtightness at the opening 26a may be disposed at an inner circumference of the opening 26a.

Further, a plurality of electric cables 120b extend from the power unit 92. The plurality of electric cables 120b pass through an insulating holding member 121b which penetrates the supporting plate 116, and extend into the second chamber 202 from the first chamber 201. The electric cables 120b inside the second chamber 202 extend into the first chamber 201 through a plurality of insulating holding members 121c which penetrate the supporting plate 115, and are connected to the servo amplifier 91.

Although the electric cables 120a and 120b generate heat when power is supplied to the servo amplifier 91 and the power unit 92, they are cooled by contacting air inside the second chamber 202 and exchanging heat. By the generation of the heat at the electric cables 120a and 120b being suppressed, a generation of heat at the servo amplifier 91 and the power unit 92 is suppressed.

In accordance with the robot control device 1A according to the modification described above, effects similar to the above embodiment can be acquired. Further, the electric cables 120a and 120b extending from the servo amplifier 91 and the power unit 92 of the first circuit 90 may be disposed so as to pass through the second chamber 202. The electric cables 120a and 120b generate heat when power is supplied. Moreover, the electric cables 120a and 120b may receive heat transferred from the servo amplifier 91 and the power unit 92. The electric cables 120a and 120b which pass through the second chamber 202 may be cooled by exchanging heat with air inside the second chamber 202.

Other Embodiments

As described above, although the examples of the embodiment of the present disclosure are described, the present disclosure is not limited to the embodiment and the modification. That is, various modifications and improvements are possible within the scope of the present disclosure. For example, modes obtained by applying various modifications to the embodiment and the modification, and modes built by combining the components in different embodiments and modifications also fall within the scope of the present disclosure.

For example, although in the above embodiment and modification the blower device 40 is disposed at or near the first door openings 30a and 30b, it is not limited to this configuration. For example, the blower device 40 may be disposed at the door 30, or may be disposed at any positions inside the second chamber 202. The blower device 40 is preferably configured so as to generate the air flow in the direction toward the second openings 24a-24d from the first door openings 30a and 30b, or in the opposite direction.

For example, the blower devices 40 may be disposed both at the first door openings 30a and 30b and near the first door openings 30a and 30b. For example, the blower device or the blower devices 40 may be disposed one or both of at the second openings 24a-24d and near the second openings 24a-24d. That is, at least one blower device 40 may be disposed at least one of the positions at the first door openings 30a and 30b and the positions near the first door openings 30a and 30b, the positions at the second openings 24a-24d, and the positions near the second openings 24a-24d. Two or more blower devices 40 may be disposed.

When the blower device 40 is disposed at the second openings 24a-24d or near the second openings 24a-24d, since the blower device 40 is disposed at an end part of the second chamber 202, it is possible to effectively use the space inside the second chamber 202. Further, regardless of the door 30 being opened and closes, it is possible to access the blower device 40. For example, regardless of the door 30 being opened and closed, it is possible to perform the inspection, repair, replacement, etc. of the blower device 40.

Moreover, although, in the above embodiment and modification the servo amplifier 91, the power unit 92, the transformer 102, etc. are disposed as the heat generating elements in the first chamber 201 and the third chambers 203a and 203b of the casing 10, the heat generating elements are not limited to this configuration. The heat generating element may be an electrical component or an electronic component, such as a resistance element, or may be other heating elements, as long as it is capable of generating heat.

Further, although in the above embodiment and modification the first chamber 201 and the third chambers 203a and 203b are disposed at the opposite side with respect to the second chamber 202, they are not limited to this configuration. The first chamber 201 and the third chambers 203a and 203b may be disposed in any way as long as they are adjacent to the second chamber 202. For example, the first chamber 201 may be adjacent to the first partition wall 26, and the third chambers 203a and 203b may be adjacent to the bottom wall 21 or the top wall 25.

What is claimed is:

1. A control device for a robot, configured to control the robot, comprising:
a casing including a main body having a first opening and a second opening disposed at a wall opposing to the first opening, and a door provided to the main body so as to open and close the first opening;
a first circuit including a heat generating element configured to generate heat by being supplied with power; and
at least one blower device,
wherein the main body includes:
a first chamber accommodating the first circuit and open at the first opening; and
a second chamber adjacent to the first chamber via a first partition wall and open at the first opening and the second opening,
wherein the door has a door opening penetrating the door and disposed so as to be communicable with the second chamber,
wherein, when the door closes the first opening, the door closes the first chamber and communicates the second chamber with the outside via the door opening, and
wherein the at least one blower device is disposed at least one of positions at the door opening, near the door opening, at the second opening, and near the second opening, and is configured to introduce and discharge air into/from the second chamber,
wherein the control device further includes a second circuit in a third chamber provided to the main body;
wherein the third chamber is adjacent to the second chamber via a second partition wall,
wherein the third chamber is open at the first opening, and when the door closes the first opening, the third chamber is closed by the door.

2. The control device of claim 1, wherein the first opening and the second opening are disposed at positions opposing to each other.

3. The control device of claim 1, further comprising a first heat sink disposed at the first partition wall,
wherein the first heat sink is disposed so that the first heat sink contacts air inside the second chamber and the heat of the heat generating element of the first circuit is transferable thereto.

4. The control device of claim 3, wherein the first circuit includes a first heat generating element and a second heat generating element as the heat generating element,
wherein the first heat sink comprises at least two first heat sinks disposed so that the heat of the first heat generating element and the second heat generating element is transferable thereto, and
wherein the first heat sink to which the heat of the first heat generating element is transferable, and the first heat sink to which the heat of the second heat generating element is transferable are disposed in a direction intersecting with a direction of an air flow generated inside the second chamber by the blower device.

5. The control device of claim 1, wherein an electric cable extending from the heat generating element of the first circuit is disposed through the second chamber.

6. The control device of claim 1, wherein the door is provided with at least one of a breaker switch, a connecting device with a manipulator of the robot, a setting device of an operating mode of the robot, and an emergency stopping device of the robot.

7. The control device of claim 1, further comprising a second heat sink disposed at the second partition wall,
wherein the second heat sink is disposed so that the second heat sink contacts air inside the second chamber and the heat of the second circuit is transferable thereto.

8. A control device for a robot, configured to control the robot, comprising:
a casing including a main body having a first opening and a second opening disposed at a wall opposing to the first opening, and a door provided to the main body so as to open and close the first opening;
a first circuit including a heat generating element configured to generate heat by being supplied with power; and
at least one blower device,
wherein the main body includes:
a first chamber accommodating the first circuit and open at the first opening; and
a second chamber adjacent to the first chamber via a first partition wall and open at the first opening and the second opening, wherein the door has a door opening penetrating the door and disposed so as to be communicable with the second chamber,
wherein, when the door closes the first opening, the door closes the first chamber and communicates the second chamber with the outside via the door opening, and
wherein the at least one blower device is disposed at least one of positions at the door opening, near the door opening, at the second opening, and near the second opening, and is configured to introduce and discharge air into/from the second chamber,
wherein the control device further includes a first heat sink disposed at the first partition wall,
wherein the first heat sink is disposed so that the first heat sink contacts air inside the second chamber and the heat of the heat generating element of the first circuit is transferable thereto,
wherein the first circuit includes a first heat generating element and a second heat generating element as the heat generating element,
wherein the first heat sink comprises at least two first heat sinks disposed so that the heat of the first heat generating element and the second heat generating element is transferable thereto, and
wherein the first heat sink to which the heat of the first heat generating element is transferable, and the first heat sink to which the heat of the second heat generating element is transferable are disposed in a direction intersecting with a direction of an air flow generated inside the second chamber by the blower device.

9. The control device of claim 8, further comprising a second circuit in a third chamber provided to the main body,
wherein the third chamber is adjacent to the second chamber via a second partition wall.

10. The control device of claim 9, further comprising a second heat sink disposed at the second partition wall,
wherein the second heat sink is disposed so that the second heat sink contacts air inside the second chamber and the heat of the second circuit is transferable thereto.

11. The control device of claim 10, wherein the third chamber is open at the first opening, and when the door closes the first opening, the third chamber is closed by the door.

12. The control device of claim 9, wherein the third chamber is open at the first opening, and when the door closes the first opening, the third chamber is closed by the door.

* * * * *